(12) United States Patent
Moore et al.

(10) Patent No.: US 7,843,689 B2
(45) Date of Patent: Nov. 30, 2010

(54) FIRE RESISTANT AND WATER RESISTANT ENCLOSURE FOR OPERABLE COMPUTER DIGITAL DATA STORAGE DEVICE

(76) Inventors: Robby Jay Moore, 13049 Windsong Ct., Auburn, CA (US) 95602; Brooks Ira Davis, 1561 Kanaka Valley Rd., Rescue, CA (US) 95672

( * ) Notice: Subject to any disclaimer, the term of this patent is extended or adjusted under 35 U.S.C. 154(b) by 0 days.

(21) Appl. No.: 12/387,663

(22) Filed: May 6, 2009

(65) Prior Publication Data

US 2009/0219679 A1    Sep. 3, 2009

Related U.S. Application Data

(63) Continuation-in-part of application No. 12/319,019, filed on Dec. 31, 2008, and a continuation-in-part of application No. 12/009,072, filed on Jan. 16, 2008, and a continuation-in-part of application No. 11/980,215, filed on Oct. 30, 2007, which is a continuation-in-part of application No. 11/285,854, filed on Nov. 23, 2005, now Pat. No. 7,291,784, which is a continuation-in-part of application No. 11/112,552, filed on Apr. 22, 2005, now Pat. No. 7,211,742.

(60) Provisional application No. 61/127,217, filed on May 9, 2008, provisional application No. 61/132,497, filed on Jun. 19, 2008.

(51) Int. Cl.
*H05K 7/20* (2006.01)
*E05G 1/00* (2006.01)

(52) U.S. Cl. .................... 361/690; 361/695; 174/520; 174/521; 312/409; 109/41; 109/65

(58) Field of Classification Search ............ 361/679.46, 361/679.48, 679.53, 688, 689, 690–697, 361/712, 714, 717–727; 165/80.3, 80.4, 165/80.5, 104.33, 185; 174/17 SF, 50, 52.1, 174/521, 544, 520; 29/428, 434; 428/15, 428/34.4–35.7, 307.7, 920, 921; 312/223.2, 312/223.3, 213, 214, 409; 109/24, 65, 80.82, 109/83, 84, 184, 41
See application file for complete search history.

(56) References Cited

U.S. PATENT DOCUMENTS 3,559,594 A * 2/1971 Miller .................... 109/84

(Continued)

*Primary Examiner*—Michael V Datskovskiy
(74) *Attorney, Agent, or Firm*—Bruce H Johnsonbaugh (57) ABSTRACT

A fire resistant and water resistant enclosure for an operable computer digital data storage device is provided. The enclosure has walls made of gypsum or concrete and, in one embodiment, has two small ventilation openings which remain open during normal operation of the digital data storage device and during the presence of fire. This embodiment has no moving parts. In the presence of fire, air and superheated steam from inside the enclosure expand and flow outwardly through the ventilation passageways. As those gases flow outwardly, they simultaneously block or prevent the transfer of heat from the exterior fire inwardly through those passageways. A water resistant pouch or coating surrounding the storage device prevents damage from flood, water, steam generated by the insulation or smoke from passing through said passageways and damaging the storage device. Another embodiment is provided utilizing one or more movable hatches which, in the presence of fire, cannot completely close, allowing superheated steam to escape from the enclosure yet during normal operation allow for better ventilation and cooling. A method is also provided for protecting the data storage device wherein the walls of the enclosure are supersaturated with water. The walls are coated with a vapor barrier such as plastic skin, plastic container or wax to prevent evaporation of water. In the presence of fire, the vapor barrier melts and the excess water stored in the walls absorbs latent heat of vaporization and extends the amount of time over which the enclosure is able to protect the storage device from damage.

8 Claims, 7 Drawing Sheets

U.S. PATENT DOCUMENTS

| | | | |
|---|---|---|---|
| 4,048,926 A * | 9/1977 | Brush et al. | 109/65 |
| 4,574,454 A * | 3/1986 | Dyson | 29/434 |
| 4,685,303 A * | 8/1987 | Branc et al. | 62/3.3 |
| 4,685,402 A * | 8/1987 | Nelson et al. | 109/65 |
| 4,694,119 A * | 9/1987 | Groenewegen | 174/521 |
| 4,735,155 A * | 4/1988 | Johnson | 109/24 |
| 4,831,476 A * | 5/1989 | Branc et al. | 360/97.02 |
| 5,069,358 A * | 12/1991 | Avery, Jr. | 220/560.01 |
| 5,377,514 A * | 1/1995 | Robbins et al. | 70/452 |
| 5,585,174 A * | 12/1996 | Levitsky et al. | 428/307.7 |
| 5,623,597 A * | 4/1997 | Kikinis | 726/18 |
| 5,637,362 A * | 6/1997 | Chase et al. | 428/15 |
| 5,756,934 A * | 5/1998 | Purdom | 174/544 |
| 6,158,833 A * | 12/2000 | Engler | 312/409 |
| 6,365,244 B1 * | 4/2002 | Ren et al. | 428/35.7 |
| 6,686,003 B2 * | 2/2004 | Legare | 428/34.4 |
| 7,046,469 B2 * | 5/2006 | Tanaka | 360/69 |
| 7,099,157 B2 * | 8/2006 | Boer et al. | 361/721 |
| 7,232,197 B2 * | 6/2007 | Davis | 312/409 |
| 7,245,491 B2 * | 7/2007 | Throckmorton et al. | 361/695 |
| 7,291,784 B2 * | 11/2007 | Moore et al. | 174/50 |
| 7,399,719 B2 * | 7/2008 | Henan et al. | 442/136 |
| 7,545,639 B2 * | 6/2009 | Ridge | 361/690 |
| 2007/0061598 A1 * | 3/2007 | Bitton et al. | 713/194 |

* cited by examiner

FIRE RESISTANT AND WATER RESISTANT ENCLOSURE FOR OPERABLE COMPUTER DIGITAL DATA STORAGE DEVICE

CROSS REFERENCE TO RELATED APPLICATIONS

This application is a Continuation-in-Part of U.S. application Ser. No. 12/319,019 filed Dec. 31, 2008; and a Continuation-in-Part of U.S. application Ser. No. 12/009,072 filed Jan. 16, 2008.

This application is also a Continuation-in-Part of U.S. application Ser. No. 11/980,215 filed Oct. 30, 2007; which is a Continuation-in-Part of U.S. application Ser. No. 11/285,854 filed Nov. 23, 2005 (now U.S. Pat. No. 7,291,784); which is a Continuation-In-Part of U.S. application Ser. No. 11/112,552 filed Apr. 22, 2005 (now U.S. Pat. No. 7,211,742).

This application also claims the benefit of and priority from U.S. provisional application Ser. No. 61/127,217 filed on May 9, 2008 and Ser. No. 61/132,497 filed on Jun. 19, 2008.

BACKGROUND AND BRIEF SUMMARY

The present invention pertains to water and fire resistant enclosures for operable computer data storage devices. More particularly, by some estimates over 80% of the damage in a fire is actually caused by water exposure and not the fire! Extreme water pressure from fire hoses or damage from automatic sprinklers typically causes more damage than the fire itself. In addition, vast amounts of steam, superheated and generated by typical fire resistant insulations serve to also damage data storage devices if the steam is managed incorrectly. The present invention provides significant improvements in the cost and performance of these enclosures during normal operation as well as in the presence of a fire and/or flood.

A problem with the movable hatch and fan design of U.S. Pat. No. 7,211,742 is that when the enclosure walls are made of gypsum or concrete, in the presence of fire, the movable hatch (or hatches) completely seals the ventilation openings of the enclosure. The prior art describes multiple enclosures for data storage devices using water based fire resistant insulations in which the enclosures are completely sealed. Similar to the effect of a stove top pressure cooking device for cooking food, a completely sealed container combined with the water carried by and chemically bound inside the gypsum or concrete walls is turned to steam and becomes superheated and pressurized since it is unable to easily escape from the interior chamber of the enclosure. The superheated steam, useful in cooking turkey, can easily destroy a data storage device beyond repair and cause the loss of valuable data. Allowing said steam to escape by not completely sealing the enclosure can dramatically reduce the interior temperature of the enclosure by over 100° F. allowing for greatly improved chances when recovering data after a fire.

One aspect of the invention is to overcome the above stated problem by preventing the movable hatch (or hatches) from completely sealing the ventilation opening in the presence of fire. This aspect is useful for relatively high power (20 to 2000 watts) data storage devices. The movable hatch concept allows a relatively large opening (2% or more than the external surface area of the enclosure) for the computer data storage device to allow for maximum airflow during normal operations for sufficient cooling. When exposed to high ambient temperatures over 200° F., such as in a fire, the movable hatches would nearly completely close to protect from exterior heat. During the fire though, a critical difference from the prior art would be movable hatches that are designed to not completely close but allow a slight opening of 1% or less of the total external surface area of said enclosure for superheated steam to escape resulting in a dramatically cooler inner temperature than a completely sealed enclosure. The slight, yet critical, opening would allow the pressure inside the enclosure to equalize with the outer atmospheric pressure. From physics, the Combined Gas Law dictates $[(P_1V_1)/T_1=(P_2V_2)/T_2]$, a drop in pressure from one condition to the next with no change in volume would result in a proportional drop in temperature (Kelvins).

When comparing a data storage device with and without the small steam exhaust opening, test results have shown that the interior temperature can be decreased over 100° F. with the addition of the partially closed ventilation passageway in a fire! This dramatic improvement is critical to the survivability of electronics as when exposed to over 300°, typical active data storage media such as hard disk drives can quickly degrade and could become unrecoverable resulting in the loss of irreplaceable data.

A critical issue arises in a design with hatches that never completely seal the inner cavity. As previously mentioned, water damage caused by fire fighters and automatic sprinklers can result in more damage than the fire itself. Water, in a flood, can obviously penetrate an enclosure that never seals. A critical aspect of this invention provides a water resistant barrier around the data storage device which is completely contained inside the fire resistant enclosure. As will be shown, this critical difference enables the invention to survive water damage from multiple sources including: fire hose spray, automatic sprinklers, complete submersion and water given off as steam from the fire resistant insulation.

Another aspect of the invention is to overcome the same problem by utilizing a hatchless design. The hatchless design could be used for relatively low power devices (5-20 watts) in which during normal operation, a sufficient amount of air can be transferred through the enclosure for cooling the computer storage device contained within. It is significant to note that this embodiment of the invention has no moving parts! In the presence of fire, the insulation and chemically bound water is released through the small ventilation passageway to conduct steam outwardly before the steam becomes superheated to dangerous temperatures. The ventilation passageway is sufficiently small to prevent the transfer of excessive heat from said fire therethrough.

A further aspect of the present invention is to increase the amount of water carried by the gypsum (or concrete) to prolong the time period during which the enclosure maintains a sufficiently low interior temperature to protect the data storage device. The walls are either supersaturated or supercharged with water according to the invention. Various techniques are also utilized to prevent the supersaturated walls from losing water to ordinary evaporation. The water is critical to successful operation of the enclosure, since it can dissipate enormous amounts of heat (latent heat of vaporization of water is equal to 2260 kJ/kg) as it is converted to steam. The amount of water dissipated during a fire is proportional to the duration of protection possible by the enclosure. Assuming the gypsum or concrete is supersaturated with twice the amount of water, the enclosure has twice the cooling power and in some cases can resist the presence of fire approximately twice as long!!

The present invention relates generally to apparatus for protecting an operable computer digital data storage device from damage and loss of data resulting from fire or water exposure. More particularly, the present invention provides a compact, low cost, fire and water resistant enclosure for an operable computer digital data storage device. Typical computer digital data storage devices include computer hard disk drives, optical disk drives, solid state memory devices, tape drives, computers, or any other device which can actively read and write digital data with the intent of storing and retrieving computerized digital data. In the description below, reference is occasionally made simply to a hard disk drive as an example of a computer data storage device. It is to be understood that such a reference below is an example and not a limitation of the invention to hard drives.

Also, in the description below, reference is occasionally made simply to a fan as an example of a device to force airflow through an enclosure. There are multiple devices which actively move air known by many names such as fan, blower, air pump, etc. It is to be understood that a reference of fan below is an example and not a limitation of the types of devices to actively move air.

As digital data storage devices become able to store staggering amounts of data, the loss of a digital data storage device in disasters such as fire or flood becomes more and more catastrophic. For the home consumer, digital pictures, digital video and digitized music are becoming more and more common. By some estimates, digital storage requirements are growing at an average compounding rate of over 100% per year. According to some studies, over 90% of businesses close after experiencing catastrophic data loss. Smaller businesses and remote offices are especially vulnerable as they are typically without the resources to develop sophisticated disaster recovery plans. There is clearly a need to provide a compact, low cost, reliable fire and/or water resistant enclosure for operating digital data storage devices. The prior art contains numerous examples of enclosures that are more complicated, not waterproof, less reliable, more costly resulting in data loss when exposed to fire, floods or water damage from the act of fighting a fire.

The present invention provides an improved compact, low cost, fire and/or water resistant enclosure for an operable computer digital data storage device. The phrase "fire resistant enclosure," as used herein and in the claims, is hereby defined as an enclosure resistant to fire that occurs outside the enclosure. Fire resistance enclosures are designed to protect the contents inside the enclosure. The present invention differs from prior art "fire suppression enclosures" that are intended to suppress or to prevent the spread of fire that occurs within the enclosure, as for example in Blackmon et al, U.S. Pat. No. 6,548,753. Fire suppression enclosures are meant to protect the spread of fire to nearby objects outside the enclosure. As a result, fire suppression enclosures can be made of thin metal walls. On the other hand, fire resistant enclosures, such as the present invention, must include relatively thick, thermally insulating walls which incorporate insulation materials such as gypsum, ceramic fiber insulation or other possible fire resistant insulations. Enclosures made of thick, insulation filled walls filled with material such as gypsum present significantly different and more difficult design challenges than simple thin-walled metal enclosures due to the heat producing nature of active electronic storage devices.

The present invention includes several alternate embodiments, all of which are intended to provide low cost, reliable fire resistant and water resistant enclosures for operating hard drives and other computer data storage devices. The embodiments include, for example, hatchless enclosures with and without fans; water resistant enclosures with and without movable hatches; free convection enclosures with and without movable hatches.

The primary difference between the present invention and all known prior inventions is that the primary enclosure uses a water based insulation but is never completely sealed. Whether the enclosure has a hatch or is hatchless, a small opening is always present to allow for super heated interior steam from the insulation to escape during a fire.

One embodiment of the present invention avoids the use of movable hatches, such as shown and described in U.S. patent application Ser. No. 11/112,552, referenced above, which application is hereby included herein by reference. The hatchless embodiment of the present invention also avoids the requirement of any fire or smoke sensing apparatus. Elimination of those components results in a significantly lower cost device. The linchpin for the preferred embodiment is the discovery that vents of a sufficiently small size (1% or less of the external surface area of said enclosure) formed in a relatively thick water based fire resistant insulation such as a gypsum or concrete wall, for example, 1.5 inches thick, will prevent damage by fire while simultaneously allowing enough air ventilation in the absence of fire to cool the operating storage device! We have tested the concept with a prototype subjected to fire, with no loss of data and no serious damage to the hard drive storage device! Prior to the water based insulation releasing steam, we believe that as the internal air temperature starts to rise in the presence of fire, the internal air expands and flows outwardly through the small vent or vents. (The fan or blower that may or may not be present forces air through the vents loses power and stops operating at the outset of a fire.) The outward flow of expanding air counteracts the flow of external heat from the fire through the small vents into the internal chamber. The small vent or vents can be designed as tortuous or labyrinthian passages to reduce the amount of external heat from a fire that flows into the inner chamber. Examples are described below and shown in the drawings.

Our discovery is confirmed by the following calculation. Assuming constant atmospheric pressure, the internal volume of air will expand proportionally to the temperature rise in Kelvin ($T_{kelvin}=T_{centigrade}+273.15$) according to the ideal gas theory and Combined Gas Law $[(P_1V_1)/T_1=(P_2V_2)/T_2]$. Assuming an initial temperature of 298 K (25° C.) and a final temperature of 373 K (100° C.), the internal chamber volume of air is expected to increase by approximately 25%. Therefore, it is believed that 25% of the volume of air in the inner chamber will slowly flow outwardly through the vent or vents as the temperature of the inner chamber gradually increases by 75° C. By sizing the inner chamber and vents appropriately, we have discovered that an insulated and vented chamber can be sufficiently fire resistant to prevent loss of data from most fires!! Additionally, as the temperature inside the enclosure reaches 373 K (100° C.) in a fire, the chemically bound water molecules in the water based insulation such as in gypsum or cement begin to release as steam providing a continuous outflow of gas throughout the fires duration as long as water is still present in the insulation.

We are unaware of any prior art fire resistant enclosures for active data storage devices wherein vents in the walls remain open in the absence of fire and in the presence of fire. The prior art does include the Olzak et al U.S. Pat. No. 6,153,720 which teaches an aircraft recorder. The enclosure for the recorder includes vents which are normally closed but become opened in the presence of fire; a phase changing, heat absorbing layer melts and drains through the vents. The vents allow equalization of pressure if the recorder falls into the ocean. The Olzak et al enclosure does not teach or suggest forced air ventilation (or any ventilation) for an operating digital data storage device wherein significant amounts of heat are generated. It is simply not usable for the purpose of the present invention.

Another embodiment of the invention includes a water resistant, smoke resistant and heat conductive "pouch" (covering, water vapor barrier or waterproof enclosure) which surrounds the data storage device. The "pouch" and data storage device are both positioned inside a fire resistant enclosure. Heat generated by the data storage device is conducted through the "pouch" (preferably metal) and is thereafter transferred to the exterior of the fire resistant enclosure by a variety of techniques. The "pouch" is fully submersible and protects the device and stored data in up to 30 feet of water and/or possible damage from smoke.

Prevention of smoke or water damage is a significant issue with any enclosure with openings that readily allow water or smoke to enter the inner chamber and damage the data storage device. The present invention provides a waterproof barrier around the data storage device that conducts heat generated by the device without interfering with its operation and/or ability to properly dissipate heat.

The prior art contains devices with complicated closure mechanisms to seal off water or smoke which rely on electrically driven water sensors and electromechanical actuators to seal off openings. Because the nature of water intrusion can be sudden and the speed of closure finite, one cannot be completely certain of preventing all water damage with a sensor and actuator architecture. The present invention, by surrounding the data storage device in a water resistant 'pouch' is inherently water proof to any exposure or flood while requiring no actuation or electrical power to protect against water damage!

Another problem with prior art water based fireproof insulation enclosures is that, in some instances, when the water carried in the water based fire resistant insulation such as gypsum or concrete is exposed to a fire, the interior chamber becomes fully saturated with water vapor raising the humidity to 100%. That humidity can damage the data storage device. The waterproof barrier of the present invention can prevent damage to the data storage device from the 100% humidity condition within the chamber.

The prior art includes water and fire resistant enclosures for paper documents (see Gelb et al U.S. Pat. No. 4,992,310); however, such enclosures are wholly unsuitable for an operating computer data storage device due to a lack of any features to provide cooling to the active electronics during normal use. Without such features, the internal temperature could rise to hundreds of degrees preventing the normal operation of typical electronic storage devices. The prior art also includes cooling jackets for data storage devices, but the cooling jackets are not water resistant (see Cheon U.S. published application 2004/0190255).

The prior art includes a relatively large enclosure for operable digital data storage devices, such as the Engler U.S. Pat. No. 6,158,833, which dissipates heat generated by the digital data storage device by conduction through the insulated walls of the container. The Engler design requires a relatively large enclosure and a low wattage devices within the enclosure since it does not provide any active or fan-driven cooling system. The present invention, in contrast, provides a compact enclosure a fraction of the size of the Engler enclosure for similar wattage devices. The present invention has shown to reduce the size, weight and cost of the enclosure by up to 90% while accommodating the same or greater cooling capability. The compact size of the present invention in one embodiment is achieved primarily because of a forced-air cooling system not present in the Engler device.

The prior art includes Pehrsson WO 89/06921, which provides a concrete wall enclosure with ventilation openings, a fan, and movable hatches. However, the hatches are designed to fully block and completely seal the openings in the event of fire which would result in data loss from superheated steam being unable to escape the completely sealed container. The present invention, as noted above, never fully closes the ventilation openings overcoming the issue of superheated steam. Pehrsson also does not provide any water resistant or smoke protection for the contents of the enclosure which could result in loss of data due to damage from elements common in almost all fires such as 100% humidity, smoke, fire sprinklers or fire hoses. Pehrsson also has no provisions for complete water immersion common in hurricanes, basements with broken water pipes or flooding common in many areas.

The prior art includes other digital data storage device enclosures with a complicated array of active sensors and expensive electromechanical device to disconnect and completely seal in the inner chamber from the external environment, such as Pihl et al U.S. Pat. No. 5,479,341. The Pihl patent teaches of an enclosure that has no active cooling during normal operation and does not inherently protect the data storage device in advance of a flood but instead relies on complicated and expensive sensors and actuators to sense and shut the enclosure before water damage can occur. In addition, the Pihl enclosure is designed to completely seal off the protected interior chamber which results in no escape route for the superheated steam and elevated temperatures and pressure during a fire. The Kikinis U.S. Pat. No. 5,623,597 utilizes a rather complex, passive heat exchanger with a rather large heat sink structure. That design requires a cumbersome insulation injection mechanism to fill the heat sink space when a threshold temperature is sensed. The present invention includes a "free convection" embodiment having a much simpler and more robust design than the prior art resulting in a design that is inherently fire resistant and water resistant with no moving parts and can cost up to 90% less than previous inventions.

The prior art also includes the Kishon et al published U.S. application No. U.S. 2004/0064631 dated Apr. 1, 2004. The Kishon et al device utilizes passive conduction of heat generated by the data storage device through screws extending from ambient air to the device cover (see paragraph [0021]). This technique is limited by the relatively low amount of heat transferable through the metal screws. The active, fan-driven cooling provided by the present invention achieves a much greater cooling capacity. In addition, the Kishon patent teaches of a completely sealed enclosure and gypsum insulation which would result in superheated temperatures during a fire.

The prior art also includes forced air cooling systems for operational digital data storage devices, but not used together with a compact, fire resistant and water resistant enclosure.

A primary object of the invention is to provide a fire resistant and/or water resistant enclosure for an operable computer digital data storage device which is robust in design, can accommodate higher heat producing electronics and inexpensive to produce.

A further object of the invention is to provide a water based fire resistant insulation such as a gypsum or concrete enclosure which may or may not utilize a fan and one or more vents to create either free or forced convection cooling and in which one or more movable hatches close in the presence of fire, but wherein the hatch closure does not fully seal the vent or vents, so that steam may be released through the partially sealed vent or vents.

Another object of the invention is to provide a gypsum enclosure wherein the gypsum walls are supersaturated or supercharged with water, and wherein said additional water becomes vaporized in the presence of fire and greatly prolongs the time period during which the enclosure protects the data storage device from heat damage.

A further object of the invention is to provide a fire resistant and water resistant enclosure for an operating data storage device having a hatchless enclosure which avoids the requirement of any fire, water or smoke sensing apparatus, and which has no moving parts. The operational digital data storage device would utilize vents of a sufficiently small size to prevent damage by fire while simultaneously allowing enough air ventilation to pass therethrough in the absence of fire to cool the operating storage device.

Another object of the invention is to provide a fire resistant enclosure for an active data storage device wherein vents in the walls of the enclosure remain open in the absence of fire and in the presence of fire.

A further object of the invention is to provide an enclosure for an operating computer data storage device wherein a heat conductive "pouch" surrounds the storage device, which is submersible and inherently protects the data storage device and data stored therein in advance of any potential flood or water exposure in up to 30 feet of fresh water or salt water.

Other objects and advantages of the invention will become apparent from the following description and drawings wherein:

DETAILED DESCRIPTION OF THE DRAWINGS

The applications identified in the section entitled "Cross Reference to Related Applications" are all incorporated herein by reference.

Figure 1:
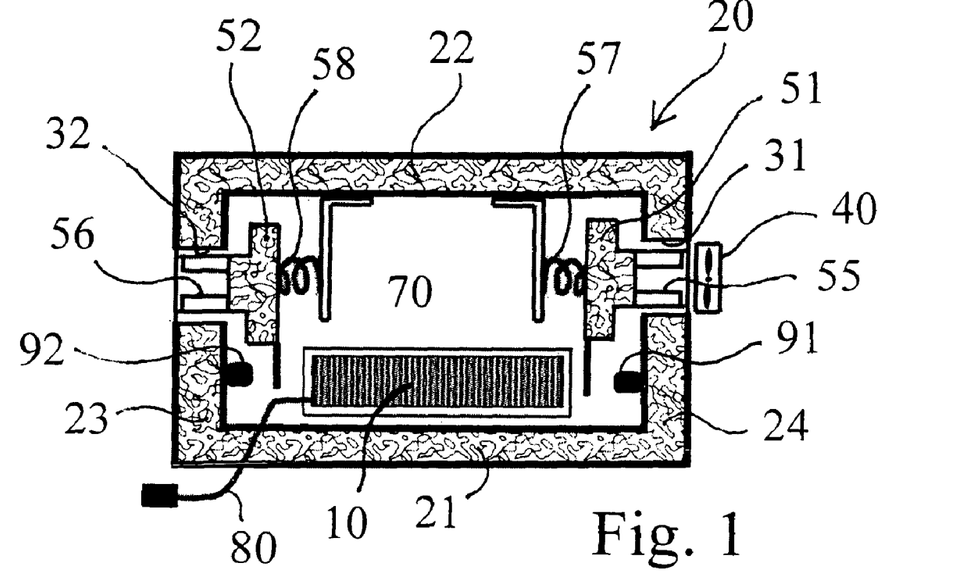
FIG. 1 is an illustration of a first embodiment utilizing movable hatches together with a fan and a stop for each hatch wherein the storage device is in normal operation without the presence of fire.

FIG. 1 illustrates a first embodiment of the present invention. An operable digital data storage device 10 is placed inside enclosure 20 having bottom wall 21, top wall 22 and side walls 23 and 24. Each of the walls 21-24 is made of either gypsum or concrete (both of which are water based, fire resistant insulators), since those materials are not only good insulators but they also have significant amounts of water chemically bonded thereto. In the presence of fire, the water separates from the gypsum or concrete and, as it is turned to steam, it absorbs enormous amounts of energy in the form of latent heat of vaporization (2260 kJ/kg for water). This absorption of energy helps maintain a low enough temperature inside enclosure 20 to protect the storage device 10 and the data stored thereon.

Openings or passageways 31 and 32 are formed in walls 24 and 23, respectively. Movable fire resistant hatches 51 and 52 are positioned adjacent openings or passageways 31 and 32. Hatches 51 and 52 have a first open position as shown in FIG. 1 wherein ambient air may pass through the opening or passageway, thereby providing a forced air ventilation system for cooling the digital data storage device 10. A fan 40 is positioned adjacent opening 31 and forces air through opening 31 through the interior or enclosure 20 and outwardly through passageway 32.

A water resistant coating, enclosure or 'pouch' 70 encloses the digital data storage device. The 'pouch' 70 must be thermally conductive to conduct the heat generated by storage device 10 and must simultaneously be water resistant. Examples of such waterproof coating are described in parent application Ser. Nos. 12/009,072 and 11/980,215 and are not described at length here. Those coatings include the following examples: aluminum foil; an extruded metallic container; an elastomeric, rubberized epoxy compound known as Cotronics "Duralco™ 4538," available at www.cotronics.com; and a reaction injection molding thermoset polyurethane polymer from www.rimnetics.com.

Stops 91 and 92 are provided to limit the motion of hatches 51 and 52 in the event of fire.

Hatch closure means includes tabs 55 and 56 and springs 57 and 58 which move hatches 51 and 52 to their "closed" position in the event of fire. Tabs 55 and 56 are temperature sensitive elements which normally cause the hatches 51 and 52 to stay open. In the presence of a threshold temperature indicative of fire, the tabs 55 and 56 melt, allowing springs 57 and 58 to move hatches 51 and 52 to their closed position.

Figure 2:
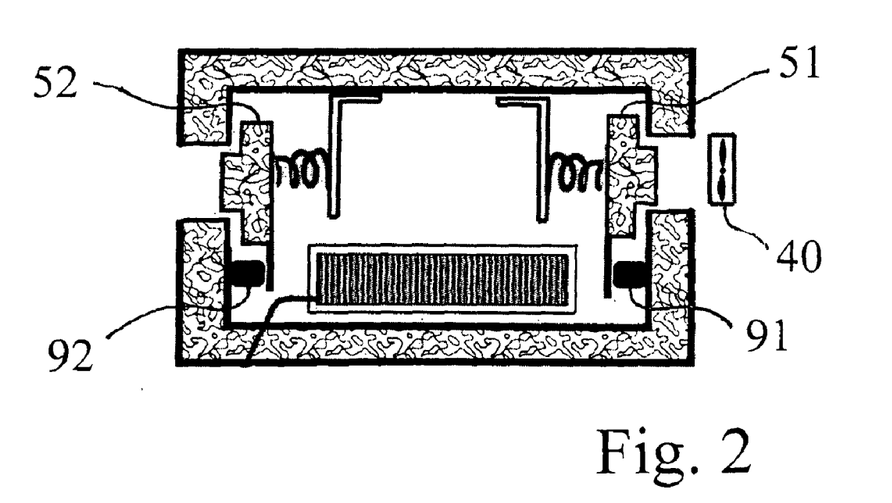
FIG. 2 is an illustration of the embodiment of FIG. 1 after a fire.

FIG. 2 illustrates the "closed" position wherein hatches 51 and 52 have contacted stops 91 and 92. Stops 91 and 92 are sized to allow hatches 51 and 52 to only partially close in the sense that the hatches 51 and 52 do not fully seat against the surfaces of side walls 24 and 23, respectively. This partial closure of hatches 51 and 52 allows a small opening between the hatches and their respective openings through which superheated steam may escape. Those restricted openings also simultaneously prevent the influx of heat from a fire through the openings as the superheated steam escapes. As noted above, if the hatches 51 and 52 are allowed to fully close and seal against side walls 24 and 23, the superheated steam may become excessively hot and cause damage to the storage device and data stored thereon.

It is also significant to note that water may enter through the opening through which superheated steam is escaping. The water resistant coating 70 completely surrounds the exterior of data storage device 10 and prevents water damage that would otherwise occur.

Figure 3:
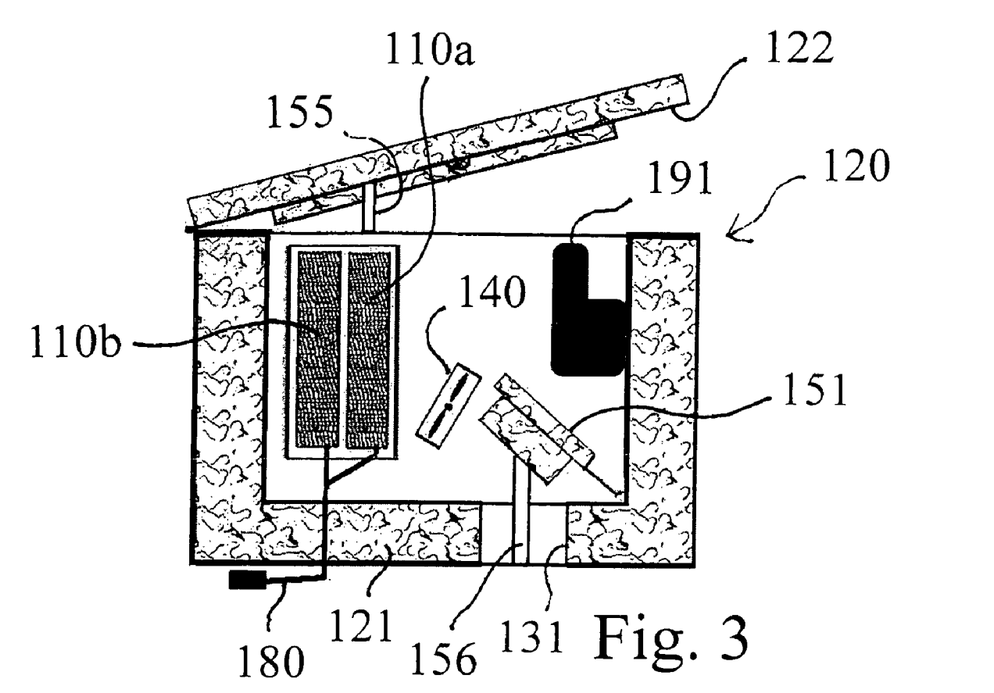
FIG. 3 illustrates a second embodiment wherein the movable top wall of the enclosure acts as a movable hatch.
Figure 4:
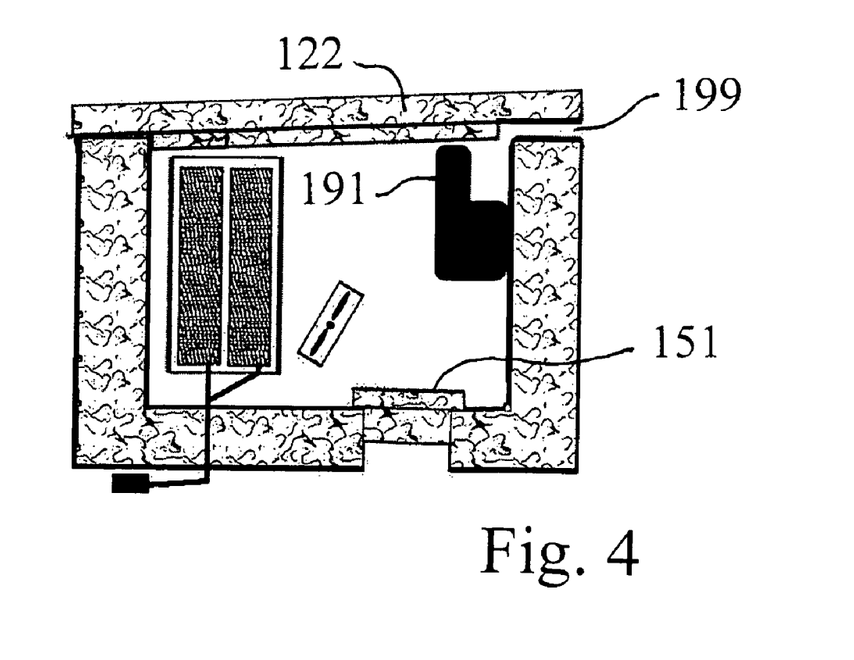
FIG. 4 is an illustration of the enclosure of FIG. 3 in the presence of fire wherein the movable top wall has contacted the stop.

FIG. 3 illustrates an optional embodiment wherein enclosure 120 has a pivotal top wall 122 and a single opening 131 formed in bottom wall 121. Two data storage devices 110a and 110b are carried within enclosure 120. Stop 191 is positioned adjacent the pivotal top wall 122 to prevent the pivotal upper wall 122 from fully closing in the event of fire. In the embodiment shown in FIG. 3, the pivoting top wall 122 acts as a movable hatch. A meltable element 155 melts at a threshold temperature indicative of the presence of fire. A pivotally mounted hatch 151 is positioned adjacent opening 131 and is held in its open position by tab 156. In this embodiment, hatch 151 is allowed to fully close in the presence of fire as shown in FIG. 4. However, stop 191 prevents the movable top wall (or hatch) 122 from completely closing, thereby providing a passageway 199 through which superheated steam escapes. In this embodiment, fan 140 is positioned inside enclosure 120 to provide forced air ventilation for the data storage devices 110a and 110b.

The lines 180 provide data and power to data storage devices 110a and 110b through lower wall 121. Those lines become destroyed in the presence of fire.

Figure 5:
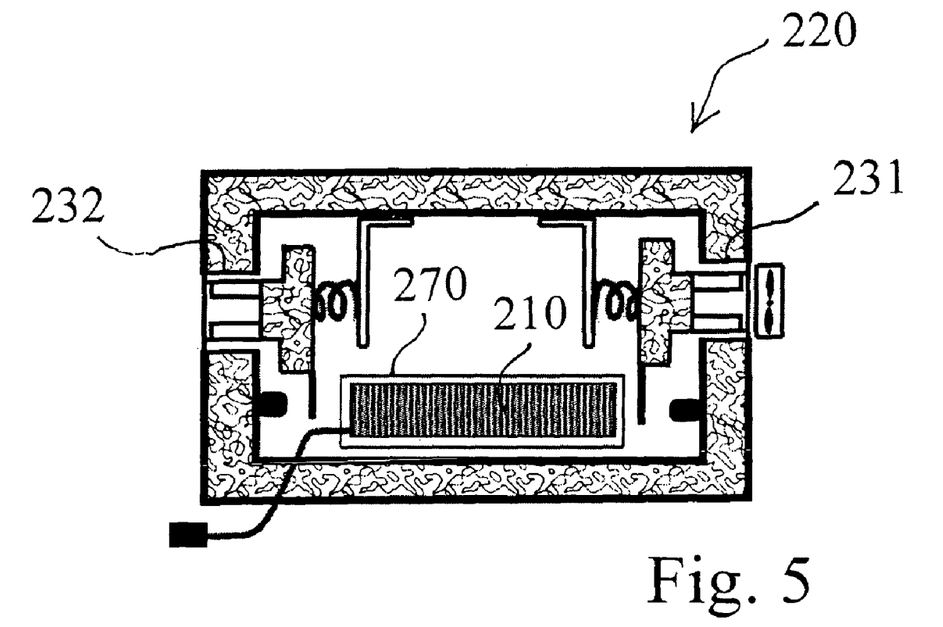
FIG. 5 illustrates an embodiment similar to that shown in FIG. 1 except no fan is provided.
Figure 6:
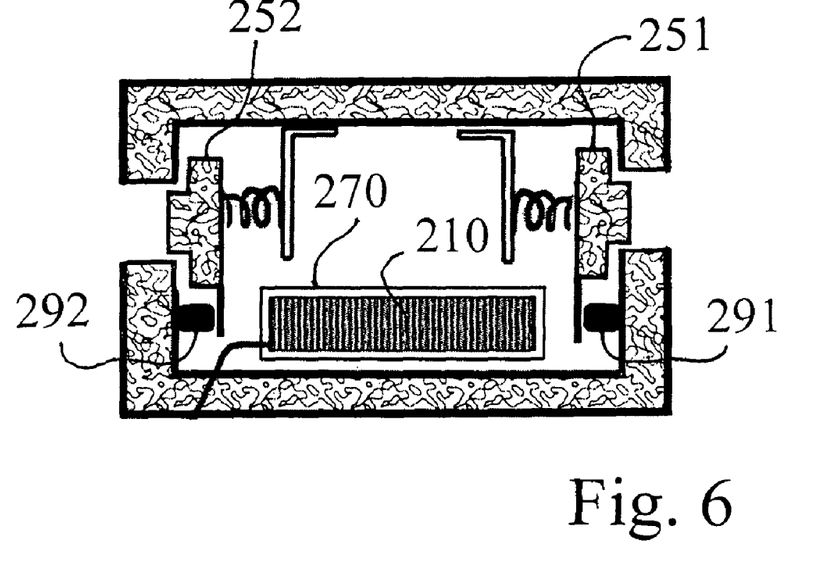
FIG. 6 illustrates the embodiment of FIG. 5 in the presence of fire, showing that the hatches do not fully close but move to a partially closed position.

FIGS. 5 and 6 illustrate another embodiment which is identical to the embodiment shown in FIGS. 1 and 2 except that no fan 40 is provided. Passageways 231 and 232 provide a "free convection" cooling of enclosure 220 by simply allowing heat generated by storage device 210 to flow upwardly through passageways or openings 231 and 232 during normal operation.

FIG. 6 shows the position of movable hatches 251 and 252 in the presence of fire. Those hatches have moved to their closed position wherein stops 291 and 292 have prevented the hatches 251 and 252 from completely sealing the openings 231 and 232, thereby allowing superheated steam to escape, and simultaneously blocking the influx of heat from a fire therethrough.

Figure 7:
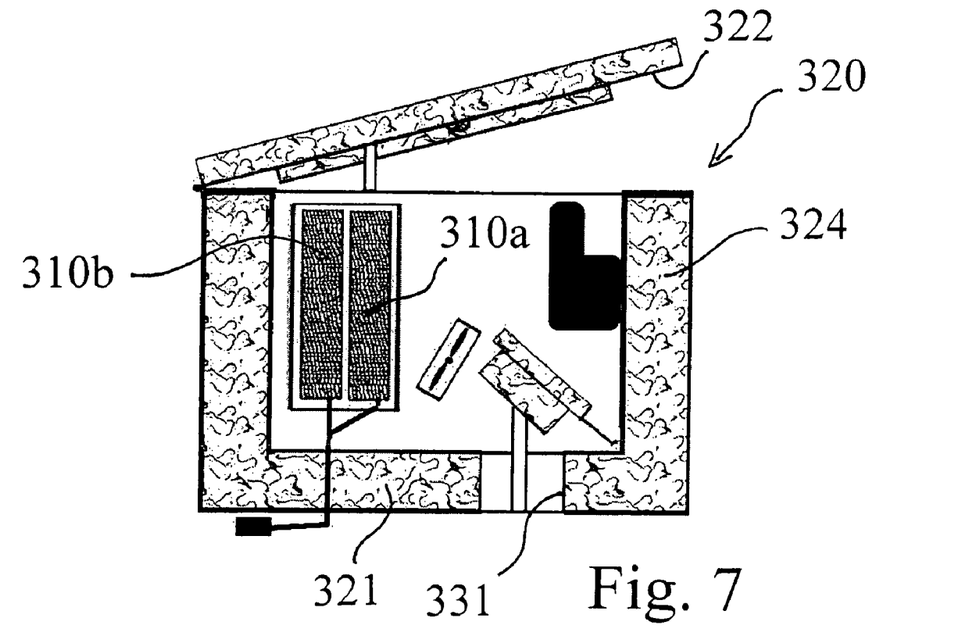
FIG. 7 illustrates an embodiment identical to that shown in FIG. 3 except that the fan is deleted.
Figure 8:
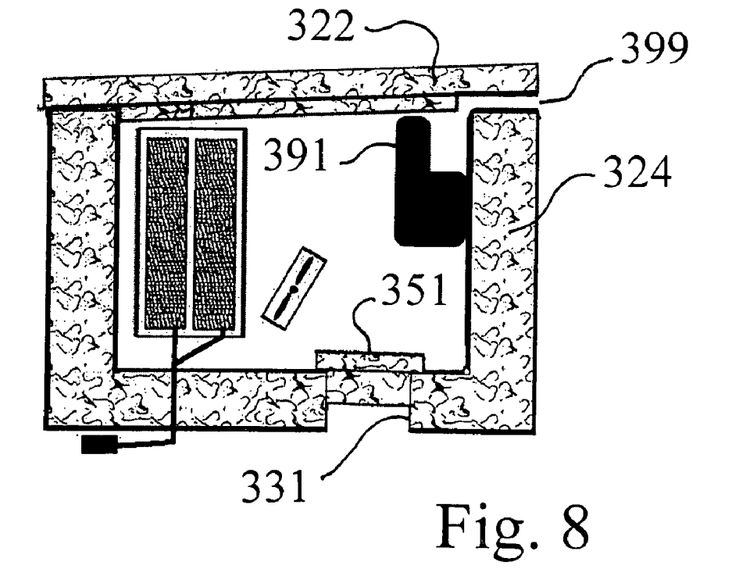
FIG. 8 shows the embodiment of FIG. 7 in the presence of fire.

FIGS. 7 and 8 illustrate an embodiment which is identical to the embodiment shown in FIGS. 3 and 4, except that the fan has been eliminated. The enclosure 320 provides free convection during normal operation of the storage devices 310a and 310b. Heat generated by storage devices 310a and 310b simply moves upwardly through the opening formed between movable upper wall 322 and side wall 324 which in turn draws cooler air inwardly through passageway 331 formed in lower wall 321 of the enclosure.

As shown in FIG. 8, in the presence of fire, the stop 391 prevents movable upper wall 322 from fully sealing against side wall 324 forming a passageway 399 that allows superheated steam to escape. Hatch 351 in this embodiment fully seals against opening 331 in the presence of fire.

Figure 9:
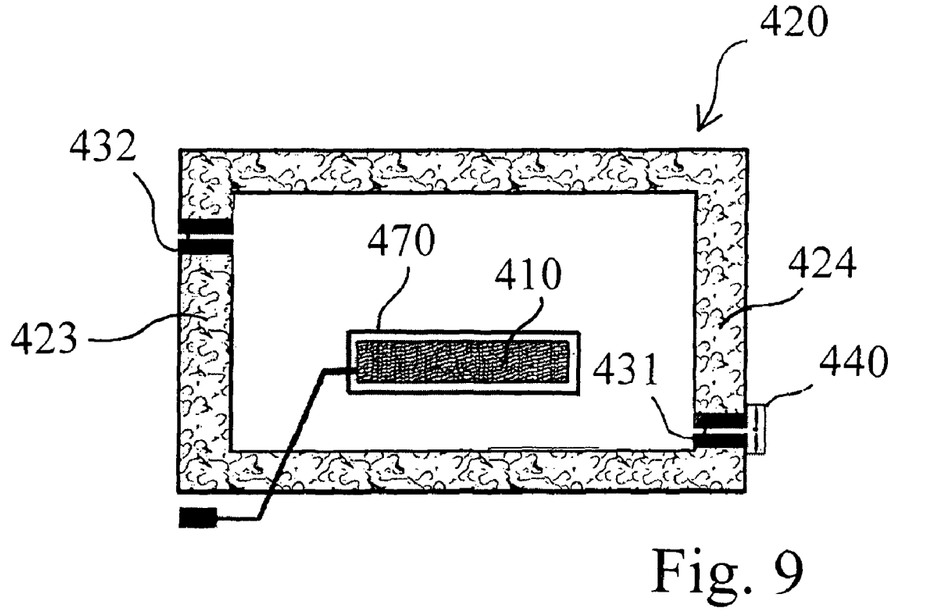
FIG. 9 illustrates an embodiment wherein the enclosure has two small ventilation openings that cooperate with the fan to ventilate the storage device during normal operation; in the presence of fire the ventilation passageways remain open allowing expanding gas and superheated steam from the interior of the enclosure to flow outwardly.

FIG. 9 illustrates an embodiment wherein enclosure 420 has small passageways or openings 431 and 432 in side walls 424 and 423, respectively. A fan 440 mounted adjacent to opening or passageway 431 provides forced air ventilation through enclosure 420. The passageways 431 and 432 in this embodiment are sufficiently small in cross-sectional area, i.e., of 1% or less than the exterior surface area of said enclosure so as to prevent or limit the intrusion of heat through those passageways in the presence of fire to prevent damage to storage device 410. Any water that enters passageways 431 and 432 either during the course of a fire from sprinkler spray, or from other sources of flooding, is prevented from damaging the storage device 410 by water resistant covering 470.

Figure 10:
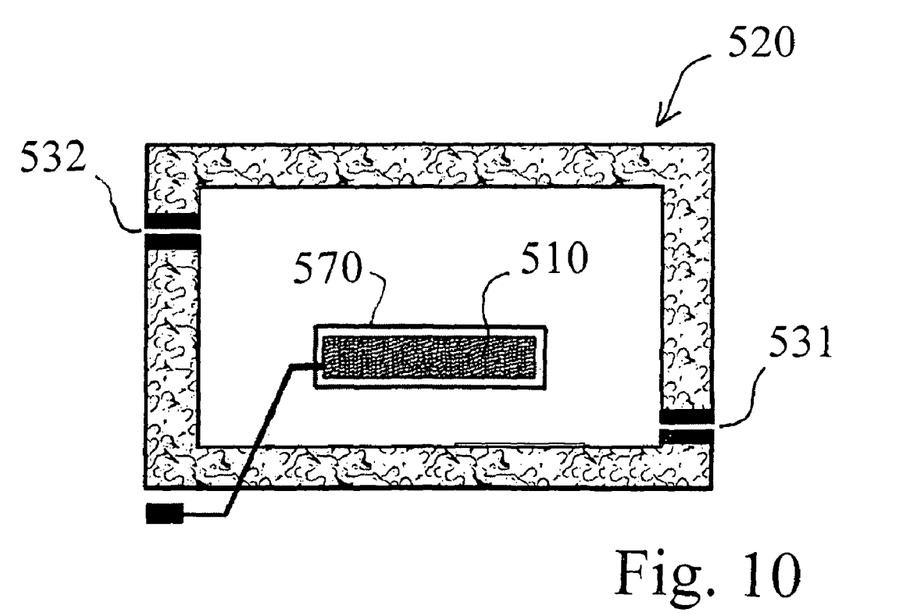
FIG. 10 illustrates an embodiment identical to that shown in FIG. 9 but where the fan has been deleted; this embodiment has no moving parts.

The embodiment shown in FIG. 10 is identical to that shown in FIG. 9 except that no fan is present in the embodiment of FIG. 10. The enclosure 520 of FIG. 10 has no moving parts. Small passageways 531 and 532 have a cross-sectional area of 1% or less of the exterior surface area of said enclosure and are capable of transmitting heat from relatively small storage devices 510 that generate less than 10 watts of energy. In the presence of fire, passageways 531 and 532 are large enough to allow expanding air and superheated steam inside enclosure 520 to escape therethrough. The passageways are also small enough to simultaneously resist or prevent the transfer of heat inwardly therethrough generated by a fire outside enclosure 520. As noted above, the expansion of air within enclosure 520 along with the generation of superheated steam causes airflow outwardly through passageways 531 and 532 during presence of a fire. This outward flow of gas and superheated steam slows down the intrusion of heat that would otherwise flow through passageways 531 and 532 in the presence of fire.

Figure 11:
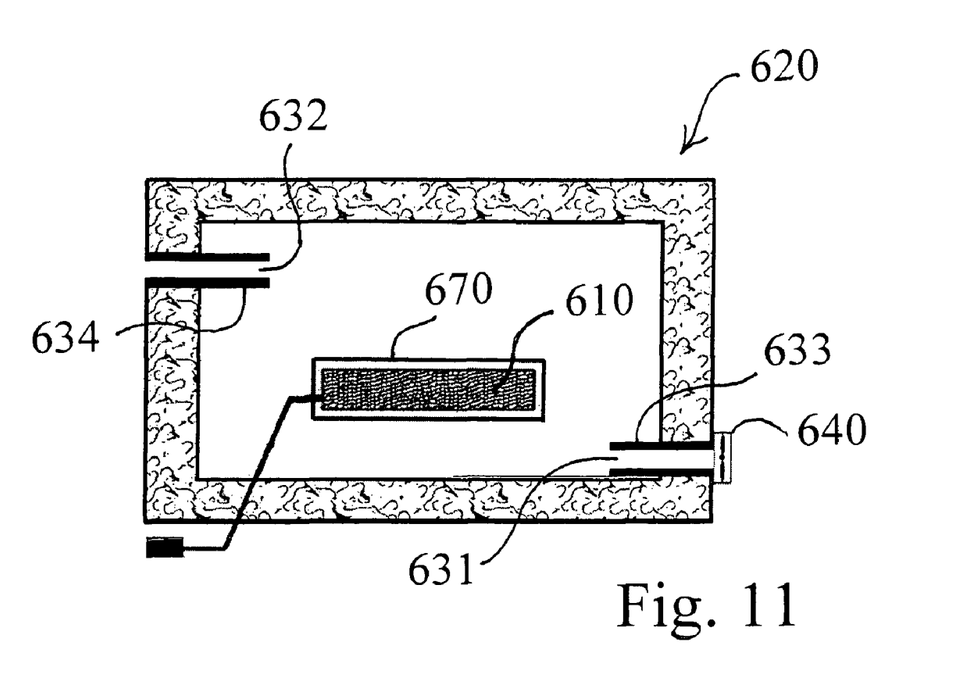
FIG. 11 illustrates a further embodiment wherein thermosensitive tubes are carried in the ventilation passageways.

FIG. 11 illustrates an embodiment wherein enclosure 620 houses data storage device 610. Waterproof coating 670 covers the exterior surface of storage device 610. Passageways 631 and 632 carry thermosensitive tubes 633 and 634. Tubes 633 and 634 are designed to melt in the presence of fire. In normal operating conditions as shown in FIG. 11, fan 640 provides forced air ventilation for storage device 610.

Figure 12:
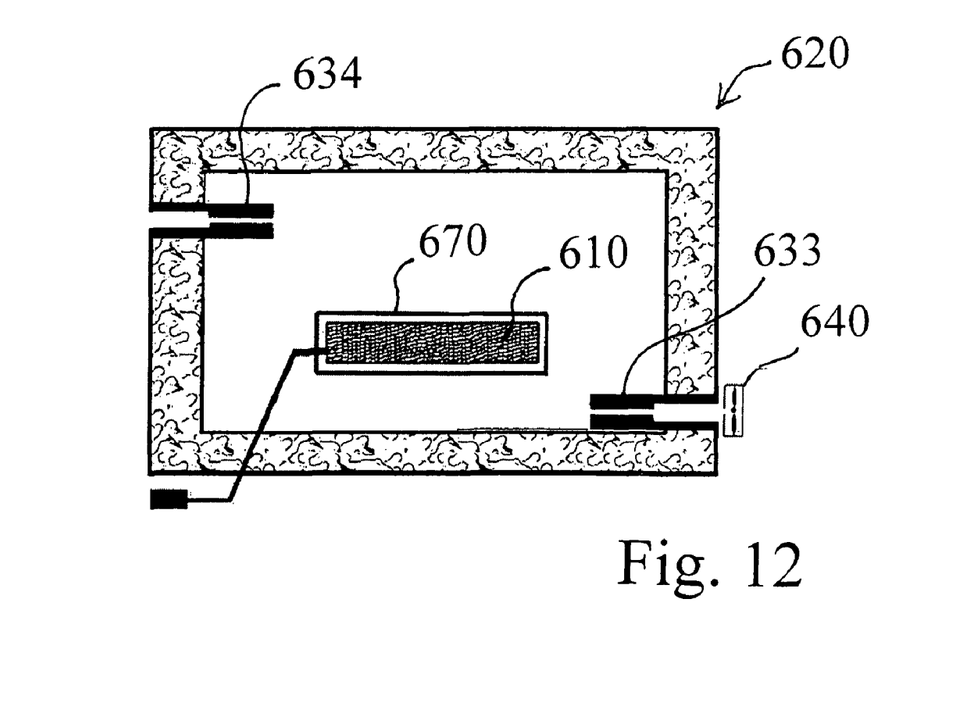
FIG. 12 illustrates the embodiment of FIG. 11 in the presence of fire wherein the thermosensitive tubes have melted but still allow escape of superheated steam.

FIG. 12 illustrates the embodiment of FIG. 11 after fire has occurred. The thermo-sensitive tubes, made from a polymer have partially melted, but still allow for the escape of superheated steam and gas.

The fan 640 illustrated in FIGS. 11 and 12 is optional and may simply be deleted.

Figure 13:
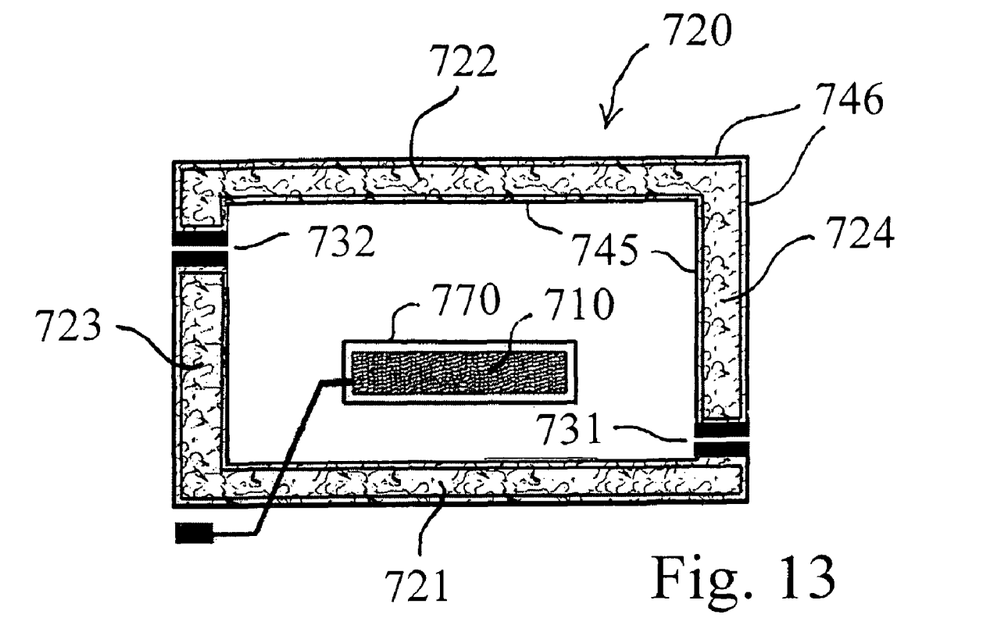
FIG. 13 illustrates an embodiment wherein the gypsum or concrete walls of the enclosure are supersaturated with water; the excess water provides added fire resistance.

FIG. 13 illustrates a further embodiment wherein enclosure 720 has its walls 721-724, which are made of either gypsum or concrete, supersaturated with water during the manufacture of enclosure 720. In order to prevent or reduce the ordinary evaporation of water from those saturated walls 721-724, a vapor barrier 745 (such as thermally sensitive wax or plastic) is applied to the interior walls of the enclosure and vapor barrier 746 (such as thermally sensitive wax or plastic) is applied to the exterior surface of walls 721-724. The vapor barrier may alternately be a plastic skin or plastic container. In this embodiment, passageways 731 and 732 are small passageways having a cross-sectional area of 1% or less than the exterior surface area of said enclosure, so that no moving parts are utilized. In the presence of fire, the vapor barriers 745 and 746 melt and allow the supersaturated water carried in the walls 721-724 to escape. The supersaturated water that escapes into the interior of enclosure 721 absorbs enormous amounts of energy as it turns to steam. This absorption of heat keeps the temperature low enough to protect storage device 710 and data stored thereon. Water resistant covering 770 prevents water damage to storage device 710. As the released water is turned to steam, the steam is released from enclosure 720 through restricted passageways 731 and 732 in order to minimize the influx of heat from the fire through those passageways.

The embodiment of FIG. 13 could also be utilized with a fan (not separately illustrated for the sake of brevity).

Figure 14:
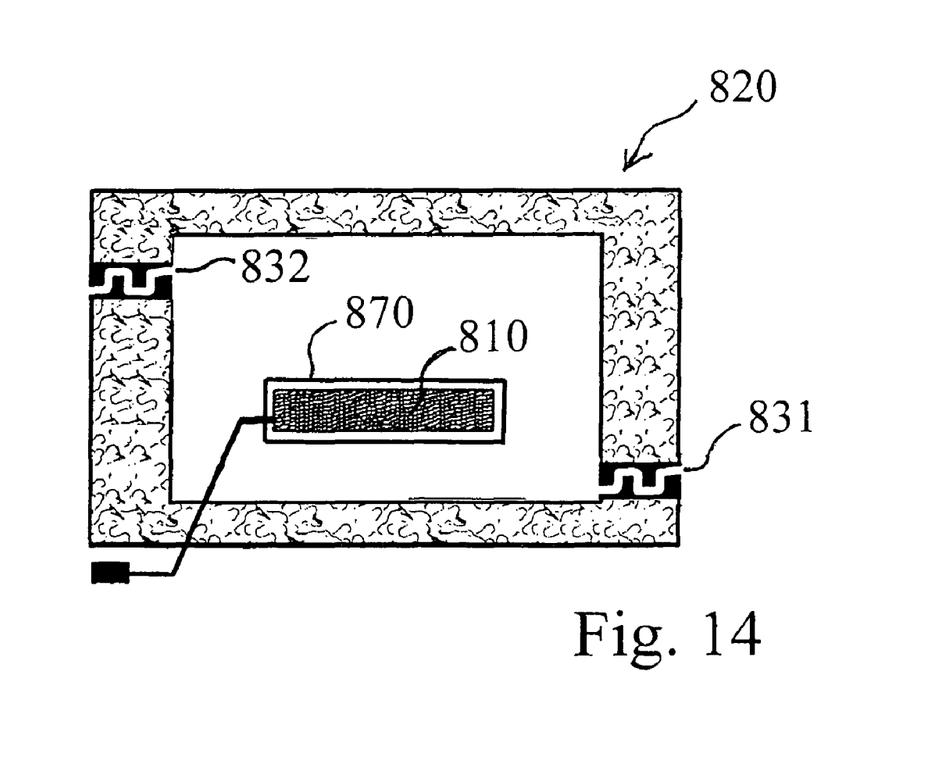
FIG. 14 illustrates an embodiment wherein the ventilation passageways are tortuous in nature.

FIG. 14 illustrates a variation of the embodiment shown in FIG. 13 wherein the small passageways 831 and 832 are tortuous. Enclosure 820 houses storage device 810 and has no moving parts. Water resistant covering 870 protects device 810.

The foregoing description of the invention has been presented for purposes of illustration and description and is not intended to be exhaustive or to limit the invention to the precise form disclosed. Modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

What is claimed is:

1. Apparatus for protecting an operable computer digital data storage device from damage or loss of data caused by fire and/or water, comprising:
   an operable digital data storage device,
   a fire resistant enclosure for said operable digital data storage device,
   said enclosure being made of water based fire resistant insulation such as gypsum or concrete,
   one or more small ventilation openings which never completely close and seal the said enclosure, said openings being of a relatively small size, approximately 1% or less of said enclosure's exterior surface area, to allow for sufficient cooling during normal operation but allow heated air and steam from inside said enclosure to escape and simultaneously prevent the transfer of heat inwardly therethrough during a fire,
   and a water resistant pouch or coating enclosing said digital data storage device contained in said enclosure.

2. The apparatus of claim 1 wherein a device used to force airflow, such as a fan, as a means for actively driving ambient air through said opening in said enclosure to cool said data storage device during normal operation.

3. The apparatus of claim 1 wherein the said relatively small openings and said data storage device (under 10 watts) are sized to provide sufficient cooling from the free convection of airflow yet allow for proper escape (1% or less than the total enclosure exterior surface area) for the steam and blockage from damaging heat during a fire.

4. Apparatus for protecting an operable computer digital data storage device from damage or loss of data caused by fire and water, comprising:
   an operable digital data storage device,
   a fire resistant enclosure for said operable digital data storage device,
   said enclosure being made of water based fire resistant insulation such as gypsum or concrete,
   a movable fire resistant hatch positioned adjacent said opening which is never allowed to completely close, said hatch of relatively large size (2% or more of total enclosure exterior surface area) and movable between an open position wherein a relatively high amount of ambient air may pass through said opening, and a partially closed position (closing to 1% or less than the total enclosure external surface area) wherein superheated steam inside said enclosure may escape through said opening,
   hatch closure means for moving said hatch from its open to its partially closed position in the presence of fire, and
   a water resistant pouch or coating enclosing said digital data storage device contained in said enclosure.

5. The apparatus of claim 4 wherein a device used to force airflow, such as a fan, as a means for actively driving ambient air through said opening in said enclosure to cool said data storage device during normal operation.

6. The apparatus of claim 4 wherein the said relatively large openings and said higher powered data storage device (over 20 watts) is sized to provide sufficient cooling from the free convection of airflow during normal operation yet partially close during a fire to allow for proper escape (1% or less than the total enclosure exterior surface area) for the super heated steam and blockage from damaging exterior heat.

7. The apparatus of claim 4 wherein said opening is partially closed with a hatch closure that consists of a thermo-sensitive tube that partially closes the ventilation opening upon sensing a fire.

8. The apparatus of claim 4 wherein said hatch closure means includes a stop which prevents said hatch from completely sealing said opening.

* * * * *